(12) United States Patent
Kim et al.

(10) Patent No.: US 6,498,388 B2
(45) Date of Patent: Dec. 24, 2002

(54) SEMICONDUCTOR MODULE WITH IMPROVED SOLDER JOINT RELIABILITY

(75) Inventors: Min-Ha Kim, Chungcheongnam-do (KR); Joong-Hyun Baek, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/995,322

(22) Filed: Nov. 26, 2001

(65) Prior Publication Data

US 2002/0074639 A1 Jun. 20, 2002

(30) Foreign Application Priority Data

Dec. 12, 2000 (KR) .............................................. 00-75484

(51) Int. Cl.⁷ ................................................. H01L 29/72
(52) U.S. Cl. ........................ 257/666; 257/669; 257/678; 257/686
(58) Field of Search ................................. 257/666, 669, 257/678, 686; 339/92

(56) References Cited

U.S. PATENT DOCUMENTS 3,867,003 A * 2/1975 Morton et al. .............. 257/666

* cited by examiner

*Primary Examiner*—Edward Wojciechowicz
(74) *Attorney, Agent, or Firm*—Marger Johnson & McCollom, PC

(57) ABSTRACT

Provided is a semiconductor memory module including semiconductor devices using solder balls as outer connection terminals, which reduces the deterioration of solder joint reliability (SJR) due to the difference in the thermal expansion coefficients of the module components. The memory module includes a module board, an upper heat sink, a lower heat sink and a linking means. The linking means is formed to have a structure that makes it possible to absorb contraction and expansion within the semiconductor module due to the different thermal expansion coefficients of the upper heat sink, the lower heat sink and the module board.

13 Claims, 4 Drawing Sheets

SEMICONDUCTOR MODULE WITH IMPROVED SOLDER JOINT RELIABILITY

BACKGROUND OF THE INVENTION

1. Field of the Invention

The present invention relates to the field of a semiconductor device, and more particularly, to a semiconductor memory module.

2. Description of the Related Art

A semiconductor module includes a plurality of semiconductor memory devices that are mounted to a printed circuit substrate as a single unit. Depending on a user's needs, various memory devices such as dynamic random access memory (DRAM), non-volatile static RAM (SRAM) or video RAM (VRAM) can be used. Among them, a semiconductor memory module using a dynamic random access memory (DRAM) is most widely used.

FIGS. 1 through 5 are diagrams for illustrating a conventional semiconductor memory module with a bolt/nut 16, and its problems.

FIG. 1 is a plan view of a conventional semiconductor memory module. FIG. 1 shows a semiconductor memory module including a module circuit unit 10, a linking unit 12 and a pin connector unit 14. The module circuit unit 10 includes a plurality of semiconductor memory devices mounted on a module board 18 to form a single circuit. If the semiconductor memory module includes an upper heat sink and a lower heat sink 20 and 22, a bolt/nut 16 is used to couple (fix) the two heat sinks together. The pin connector unit 14 is where a pin connector is formed so as to connect the semiconductor memory module to another printed circuit board.

FIG. 2 is a cross sectional view of the semiconductor memory module, taken along the line II–II' of FIG. 1. Referring to FIG. 2, in the semiconductor memory module, upper and lower semiconductor devices 26 and 28 such as a ball grid array (BGA) package or a chip scale package (CSP), are mounted on either of two opposing surfaces (top or bottom) of the module board 18, which is a type of printed circuit substrate, using solder balls as outer connection terminals. The upper and lower semiconductor devices 26 and 28 are connected to the upper and lower heat sinks 20 and 22, respectively, via a thermal interface material (TIM) layer 30.

The upper and lower heat sinks 20 and 22 are configured to enclose the module board 18 on which the semiconductor devices 26 and 28 are mounted. As discussed above, the upper and lower heat sinks 20 and 22 are coupled together with a bolt/nut 16.

FIG. 3 is an enlarged view of the portion of the cross section marked as 3 in FIG. 2. FIG. 3 shows the thermal interface material (TIM) layer 30 disposed between the semiconductor devices 26 and 28 and the heat sinks 20 and 22 to facilitate heat transfer between the semiconductor devices 26 and 28 and the heat sinks 20 and 22, respectively.

FIG. 4 is an enlarged view of the portion of the cross section marked as 4 in FIG. 2. Referring to FIG. 4, the upper heat sink 20 and the lower heat sink 22 are coupled together with bolts/nuts. Consequently, the semiconductor devices 26 and 28 are mounted on either of two opposing surfaces of the module board 18 and the upper and lower heat sinks 20 and 22 are fixed to each other using the bolt/nut 16 that are made of metal.

FIG. 5 is a cross sectional view showing a transformed shape of a conventional semiconductor memory module after a temperature cycling test.

In general, semiconductor devices are mounted in integrated electronic equipment systems consisting of hundreds to tens of thousands of components, such as a rocket, a spacecraft, an airplane, and a computer. Even if only one of the semiconductor devices mounted in an integrated electronic equipment system operates incorrectly, the integrated electronic equipment system may malfunction and need to be scrapped.

Therefore, the reliability of each semiconductor device must be ensured before it is used. To solve this problem, semiconductor device manufacturers must perform a reliability test on each of the semiconductor devices before providing the finished goods to customers.

There are many kinds of reliability tests, such as a temperature cycling test, which is usually performed to test the reliability of semiconductor devices as a function of temperature. The temperature cycling test preliminarily tests whether physical and electrical defects occur in semiconductor devices. For this, semiconductor devices are put into a chamber and are then subjected to a temperature cycle of between −65° C. and 150° C.

However, with a conventional semiconductor memory module, the bonding strength of the solder balls 32 which connect the semiconductor devices 26 and 28 to the module board 18, (the solder joint reliability (SJR)), deteriorates after the temperature cycling test. This is because components of the memory module have different coefficients of thermal expansion (CTE) relative to each other. Specifically, the CTE of silicon, the module board 18 and aluminum forming the upper and lower heat sinks are 2.6 ppm/° C., 18 ppm/° C., and 24 ppm/° C., respectively.

Accordingly, when the semiconductor memory module is subjected to the temperature cycling test, the module board 18, the semiconductor devices 26 and 28, and the upper and lower heat sinks 20 and 22 are alternately contracted and expanded. Their sizes change by different amounts depending on their CTE. For example, the TCE of the module board is higher than that of the silicon forming the semiconductor devices 26 and 28. Thus, the degree (magnitude) of contraction or expansion of the module board is greater than that of silicon.

However, as shown in FIG. 5, solder balls 32' are fixed between the semiconductor devices 26 and 28 and the upper and lower heat sinks 20 and 22 such that the semiconductor devices and the heat sinks cannot be moved responding to such contraction or expansion. In addition, bolt/nut 16 fixes each of the heat sinks 20 and 22 and the module board 18 together. For these reasons, the solder balls 32' cannot withstand the force of the contraction and expansion and can be easily disfigured.

Consequently, the solder balls lose their bonding strength between the semiconductor devices 26 and 28 and the module board 18, thereby causing fatal defects in the operation of the semiconductor memory module and severely deteriorating the reliability of the semiconductor memory module.

SUMMARY OF THE INVENTION

Accordingly, the present invention provides a memory module that reduces the deterioration of solder joint reliability, which is caused by the differences in the thermal expansion coefficients of components of the memory module.

According to one embodiment, the present invention includes a module board where a plurality of semiconductor devices are stacked, an upper heat sink in contact with the top surface of the semiconductor devices and encloses the top surface of the module board, a lower heat sink in contact with the top surface of the semiconductor devices and encloses the bottom surface of the module board, and a linking means for fixing the upper and lower heat sinks together. The linking means absorbs different degrees (variations) of contraction and expansion of the upper and lower heat sinks and the module board that occurs due to the difference in the thermal expansion coefficients between them.

The linking means can consist of a first coupling body and a second coupling body configured to be coupled (interlocked) together. When the two coupling bodies are coupled together, a gap having a predetermined width is formed at lateral sides of the linking means and extends in a direction parallel to the direction in which the two coupling bodies are coupled.

According to the present invention, the linking means can absorb different degrees of contraction and expansion of the components forming the semiconductor memory module, thereby improving the reliability of the semiconductor memory module including the solder joint reliability (SJR).

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PRESENT INVENTION

The present invention will now be described more fully with reference to the accompanying drawings, in which preferred embodiments of the invention are shown.

FIGS. 6 through 9 illustrate a semiconductor module according to an embodiment of the present invention and a linking means of the semiconductor module.

Figure 1:
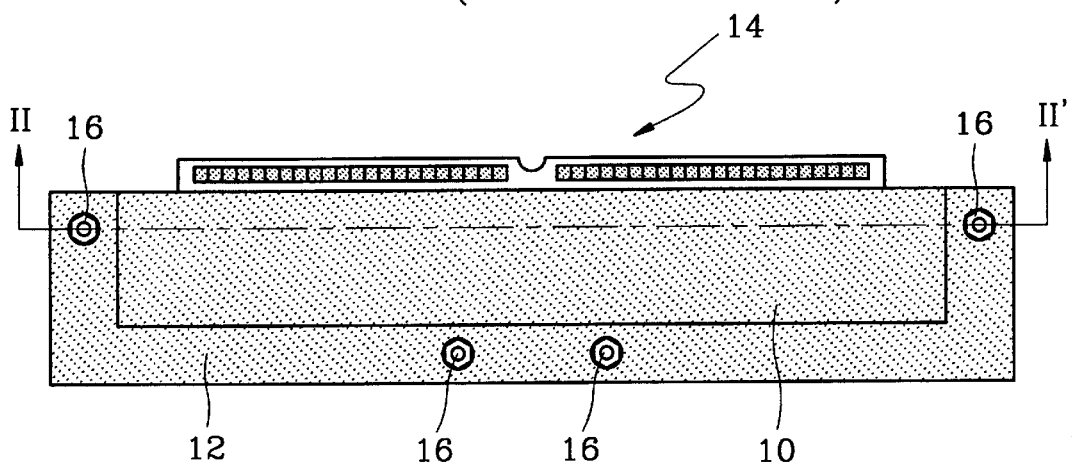
FIGS. 1 through 5 are diagrams illustrating a conventional semiconductor nodule.
Figure 2:
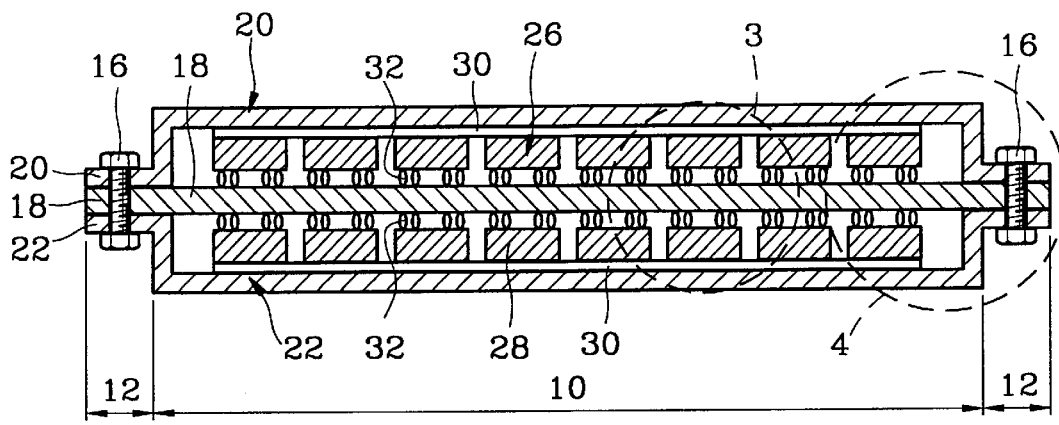
Figure 3:
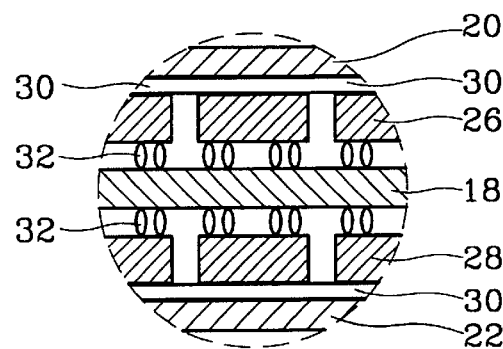
Figure 4:
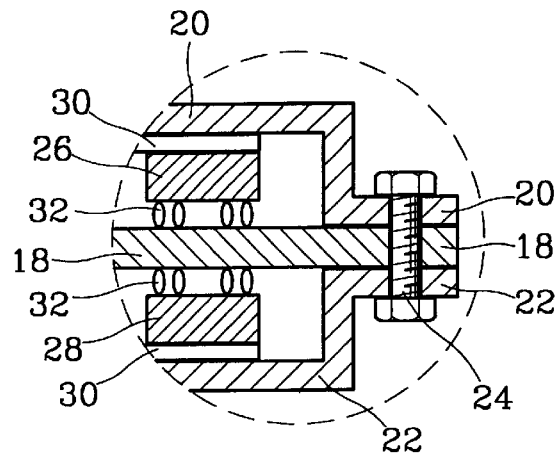
Figure 5:
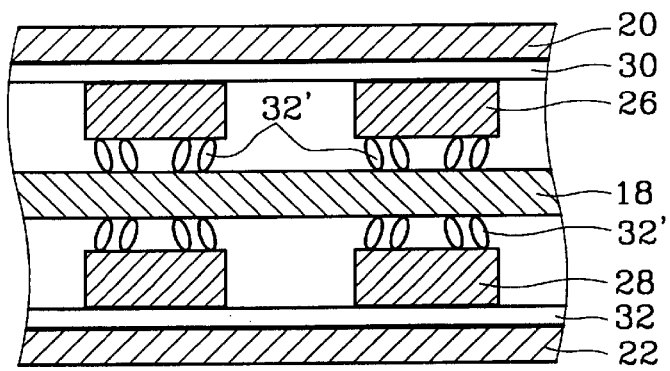
Figure 6:
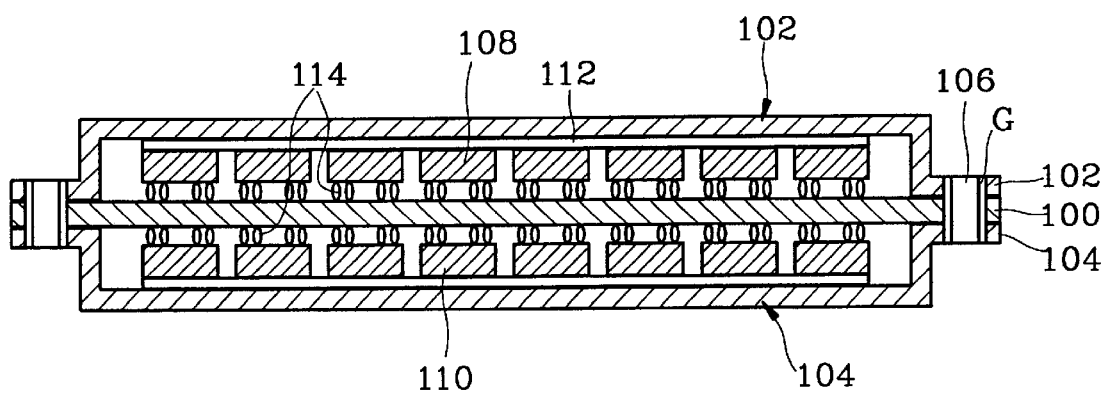
FIGS. 6 through 9 are diagrams illustrating a linking means of a semiconductor module according to the present invention and its linking method thereof.
Figure 7:
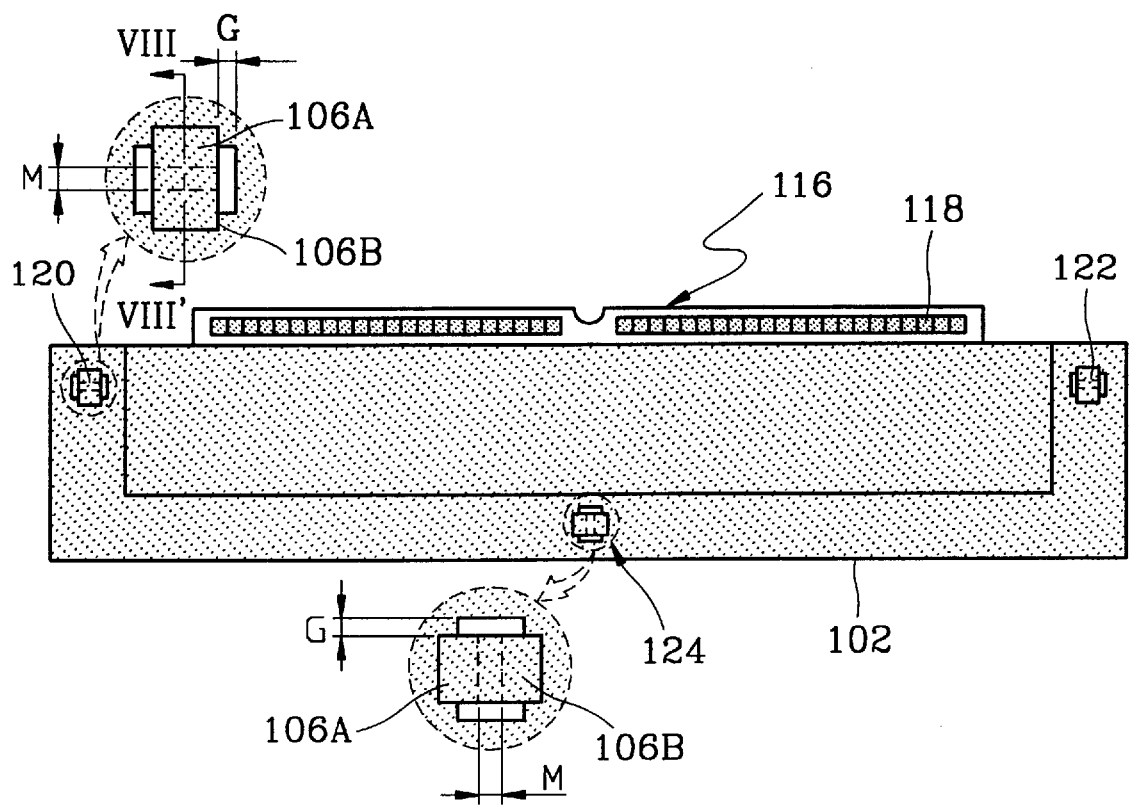

FIG. 6 is a cross sectional view illustrating a semiconductor memory module according to a preferred embodiment of the present invention, and FIG. 7 is a plan view of the semiconductor memory module. Referring to FIGS. 6 and 7, the semiconductor memory module of the present invention includes a module board 100 where a plurality of semiconductor devices 108 and 110 are mounted on the opposing top and bottom surfaces thereof. The memory module further includes an upper heat sink 102 that is thermally connected to the outwardly facing surface of the semiconductor device 108 stacked on the module board 100 and encloses the top surface of the module board 100, a lower heat sink 104 that is thermally connected to the outwardly facing surface of the semiconductor device 110 mounted on the bottom surface of the module board 100 and encloses the bottom surface of the module board 100, a linking means 106 which fixes the upper heat sink 102 and the lower heat sink 104 together with the module board 100 that is between the upper and lower heat sinks 102 and 104.

In accordance with the present invention, the linking means (106 of FIG. 6 and 120, 122, and 124 of FIG. 7) can withstand the contraction and expansion of the upper and lower heat sinks 102 and 104, the semiconductor devices 108 and 110, and the module board 100 caused by their different thermal expansion coefficients during a thermal cycle. Reference numerals 112 and 114 indicate a thermal interface material (TIM) layer and solder balls as an outer connection terminal of the semiconductor devices 108 and 110, respectively.

Preferably, the contact portion between the semiconductor devices 108 and 110 and the thermal interface material (TIM) layer 112 are not covered with an epoxy mold compound (EMC), and the semiconductor devices 108 and 110 can be a chip scale package (CSP) or ball grid array (BGA) package.

The solder balls 114 are electrically connected to the module board 100. The upper and lower heat sinks 102 and 104 can be formed of any material that facilitates heat release. In the present invention, it is preferable that the heat sinks 102 and 104 be made of aluminum.

Hereinafter, the operational structure and principle of the linking means of the semiconductor module according to the present invention will be described with reference to FIG. 7.

Referring to FIG. 7, a pin connector unit 116 is formed so as to electrically connect the semiconductor module to another printed circuit substrate and a pin connector 118 is formed within the pin connector unit 116 so as to couple the semiconductor module to another printed circuit board.

Also, the linking means 106 of FIG. 6 includes a first linking means 120, a second linking means 122, and a third linking means 124. The first and second linking means 120 and 122 can absorb different degrees of contraction and expansion of different components within a module board 100 in a lateral direction.

The first and second linking means 120 and 122 each comprises a first coupling body 106A and a second coupling body 106B. In FIG. 7, a region in which the first coupling body 106A and the second coupling body 106B are in contact with each other in a vertical direction and in a diagonal direction, is indicated as M. When the first and second linking means 120 and 122 are coupled together, a gap (G) is formed at the lateral sides in parallel with the direction in which the two coupling bodies are coupled, that is, in the lateral direction (see the partially enlarged diagram of the region marked as 120). Accordingly, even if the inner components of the semiconductor module alternately contract and expand by different amounts due to their different thermal expansion coefficients under rapidly changing temperature conditions, such as in a temperature cycling test, the first and second linking means 120 and 122 can absorb the contraction and expansion in a lateral direction by means of the gap (G) that is formed at the lateral sides of the linking means 120 and 122.

Also, the third linking means 124 is comprised of the first and second coupling bodies 106A and 106B. When the first and second coupling bodies are coupled together, the gap (G) is formed in the vertical direction. Consequently, even if the components of the semiconductor module 100 alternately contract and expand in the vertical direction, the third linking means 124 can absorb contraction and expansion in the vertical direction.

In short, the first, second and third linking means 120, 122, and 124 are comprised of two coupling bodies and couple the module board 100 to the upper and lower heat sinks 102 and 104 in a predetermined direction. The linking means 120, 122, and 124 have the gap (G) at the lateral sides thereof in parallel with the direction in which the two coupling bodies are coupled. Therefore, the gap (G) can absorb different degrees of contraction and expansion of the inner components of the semiconductor module, which occurs due to their different thermal expansion coefficients.

Figure 8:
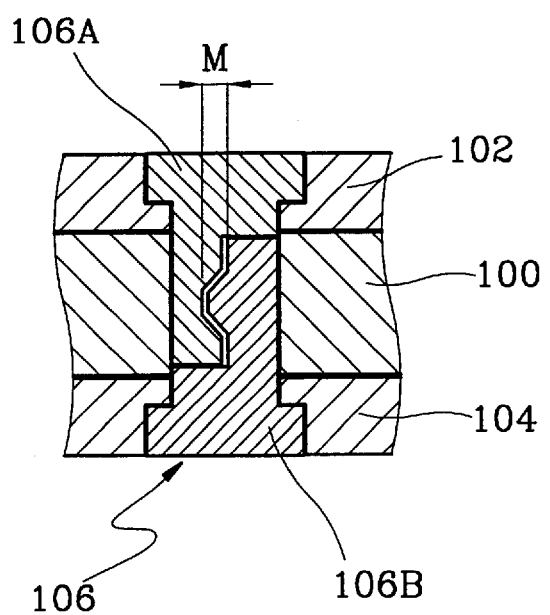
Figure 9:
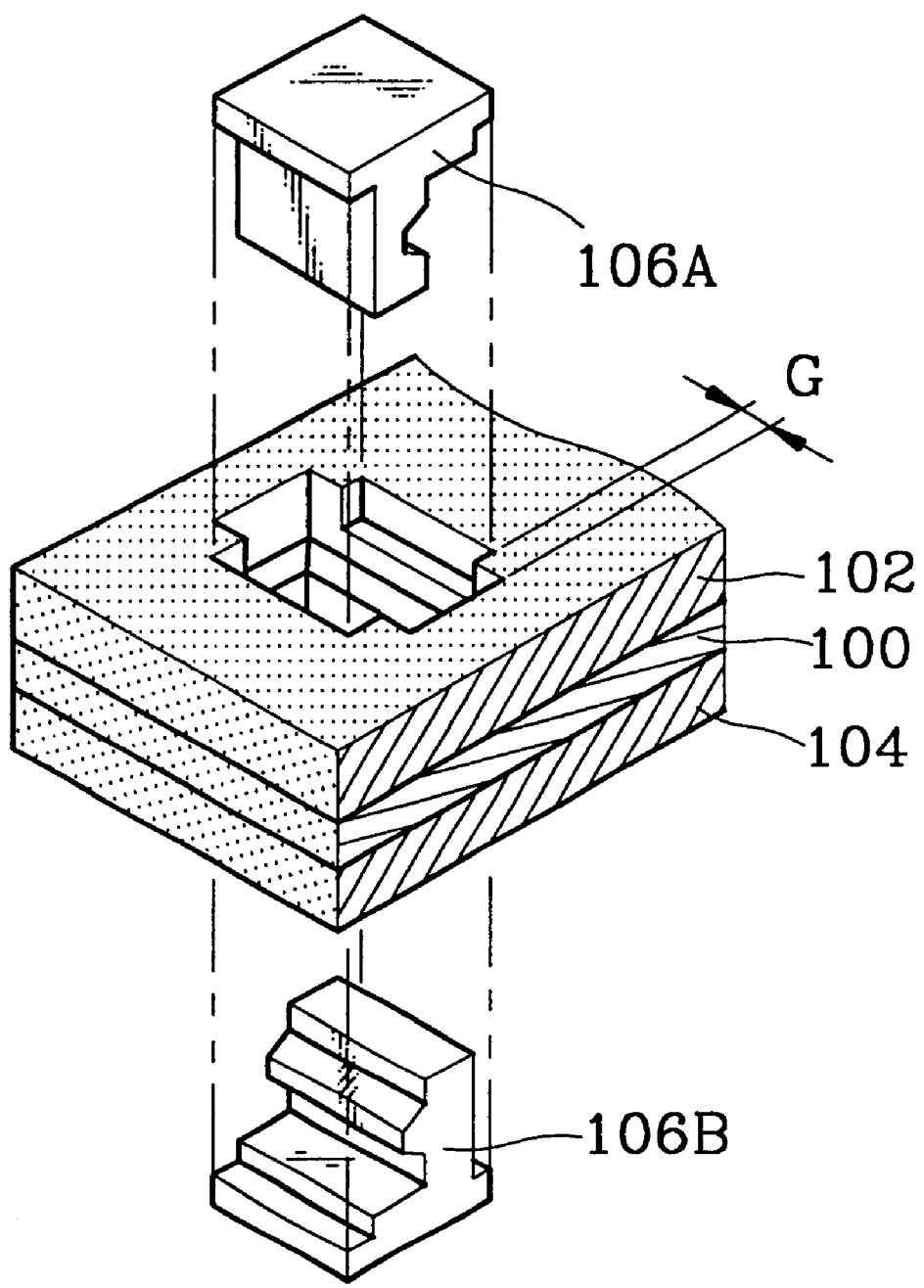

FIG. 8 is an enlarged cross sectional view of the first linking means 120, taken along the line VIII–VIII', and FIG. 9 is a perspective view illustrating a process of forming the linking means 120 by coupling the coupling bodies 106A and 106B.

Referring to FIGS. 8 and 9, the linking means 106 for fixing the heat sinks 102 and 104 to the module board 100 is formed by combining the first coupling body 106A with the second coupling body 106B.

In FIG. 9, the gap (G) is formed at the lateral sides of the two coupling bodies 106A and 106B in parallel with the direction in which the two coupling bodies 106A and 106B are coupled. With the gap (G), different degrees of contraction and expansion of the semiconductor devices 108 and 110 and the module board 100, which occurs due to the difference in the thermal expansion coefficients between them, can be absorbed. Therefore, the prior art problem, resulting from the inner components of a semiconductor module being alternately contracted and expanded, can be solved with the gap (G). Moreover, it is possible to prevent the solder balls 114 of FIG. 6 from being electrically disconnected from the module board 100 due to the disfigurement of the solder ball.

In other words, the gap (G) of the linking means 106 absorbs the contraction and expansion of the module board 100 and the upper and lower heat sinks 102 and 104 in the lateral direction or in the vertical direction, thereby enhancing the solder joint reliability (SJR) of the solder ball.

According to the present invention, the linking means can absorb different degrees of contraction and expansion of the components of a semiconductor memory module. Consequently the solder joint reliability (SJR) of the solder balls can be improved and the reliability of the semiconductor module can also be enhanced.

The structure of a linking means described above is just one example according to the present invention, and the invention should not be construed as being limited to the specific shape illustrated in the drawings. For example, in the above preferred embodiment of the present invention, the linking means has a simple structure in which the linking means for coupling upper and lower heat sinks with a module board, forms a gap in a lateral direction or in a vertical direction. However, any linking means that can fix the two heat sinks with the module board and can form a gap in any direction can also be used. Also, the present invention is described focusing on a semiconductor memory module for the sake of simplicity. However, the present invention can also be applied to a semiconductor module that performs other non-memory functions.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor module comprising:
a module board having semiconductor devices stacked on its top and bottom opposing surfaces;
an upper heat sink thermally connected to a top surface of the semiconductor devices stacked on the top surface of the module board and enclosing the top surface of the module board;
a lower heat sink thermally connected to a top surface of the semiconductor devices stacked on the bottom surface of the module board and enclosing the bottom surface of the module board; and
a linking means for fixing the upper and lower heat sinks to the module board when the module board is placed between the upper and lower heat sinks,
wherein the module board and the heat sinks include an opening formed therethrough configured to receive the linking means in such a manner that a gap is formed therebetween to absorb variations of thermal contraction and expansion of the upper and lower heat sinks and the module board.

2. The semiconductor module of claim 1, wherein the linking means comprises a first coupling body and a second coupling body configured to be coupled together.

3. The semiconductor module of claim 2, wherein the gap having a predetermined width is formed along lateral sides of the linking means and extends parallel to a direction in which the two coupling bodies are coupled.

4. The semiconductor module of claim 3, wherein the gap is configured to absorb the contraction and expansion of the upper and lower heat sinks and the module board in a lateral direction and in a vertical direction.

5. The semiconductor module of claim 4, wherein the linking means for fixing the upper and lower heat sinks to the module board in the lateral direction has the gap formed in the lateral direction.

6. The semiconductor module of claim 4, wherein the linking means for fixing the upper and lower heat sinks to the module board in the vertical direction has a gap formed in the vertical direction.

7. The semiconductor module of claim 1, wherein a portion of the semiconductor devices is in contact with the upper heat sink or the lower heat sink and is in a single crystal silicon state.

8. The semiconductor module of claim 1, further comprises a thermal interface material (TIM) layer disposed between the semiconductor devices and the upper heat sink, and between the semiconductor devices and the lower heat sink.

9. The semiconductor module of claim 1, wherein the upper and lower heat sinks are made of aluminum.

10. The semiconductor module of claim 1, wherein each of the semiconductor devices is a memory device.

11. The semiconductor module of claim 1, further comprising a pin connector unit for connecting the memory module to another substrate.

12. The semiconductor module of claim 2, wherein the first coupling body includes a channel for receiving an opposing tab formed in the second coupling body.

13. A semiconductor module comprising:
a module board having a surface,
semiconductor devices stacked on the module board surface;
one or more heat sinks thermally connected to the semiconductor devices and enclosing the module board surface; and
a linking means for fixing the one or more heat sinks to the module board,
wherein the module board and the heat sink having an opening disposed therethrough, the opening configured to receive the linking means in such a way that a gap is formed therebetween to absorb variations of thermal contraction and expansion of the heat sinks and the module board.

* * * * *